United States Patent
Cooper

(10) Patent No.: US 6,608,570 B1
(45) Date of Patent: Aug. 19, 2003

(54) MATRIX IMPLEMENTED DATA COMPRESSION APPARATUS AND METHOD

(75) Inventor: Albert B. Cooper, New York, NY (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 10/195,795

(22) Filed: Jul. 15, 2002

(51) Int. Cl.[7] .............................................. H03M 7/34
(52) U.S. Cl. ........................................ 341/51; 341/67
(58) Field of Search .............................. 341/51, 50, 63, 341/65, 67

(56) References Cited

U.S. PATENT DOCUMENTS 5,951,623 A * 9/1999 Reynar et al. ................. 341/51
6,307,488 B1 * 10/2001 Cooper ......................... 341/51

* cited by examiner

*Primary Examiner*—Brian Young
(74) *Attorney, Agent, or Firm*—Albert B. Cooper; Michael B. Atlass; Mark T. Starr

(57) ABSTRACT

A data compressor includes a matrix of AND-gates corresponding to a respective plurality of strings. An AND-gate has inputs responsive, respectively, to a representation of a prefix code and a representation of a fetched character for energizing the AND-gate output. The AND-gate outputs are coupled, respectively, to the inputs of a matrix switch and the matrix switch outputs have respective string codes assigned thereto. The matrix switch is controllable for coupling any one of the matrix switch inputs to a selected one of the matrix switch outputs. Energization of an AND-gate output coupled to a matrix switch output provides a representation of the code assigned thereto. A prefix decoder responsive to the provided representations of codes assigned to the matrix switch outputs provides decoder outputs to the prefix code inputs of the AND-gates. A character decoder responsive to fetched characters provides decoder outputs to the character inputs of the AND-gates.

14 Claims, 5 Drawing Sheets

Input Data Character Stream
$a_1\ b_1\ a_2\ b_2\ a_3\ b_3\ a_4\ b_4\ c_1\ a_5\ b_5\ c_2\ a_6\ b_6\ c_3\ a_7\ b_7\ c_4\ d_1$

| Action | Curr Match | Curr Char | Energized AND-gate Prefix Code | Energized AND-gate Char | Energized Matrix Switch Output | Output | Assigned Code | Blocks of Figure 3 |
|---|---|---|---|---|---|---|---|---|
| 1  | $a_1$ | $b_1$ | a | b | NONE | $a_1$ | 258 | 70-80 |
| 2  | $b_1$ | $a_2$ | b | a | NONE | $b_1$ | 259 | 81,74-80 |
| 3  | $a_2$ | $b_2$ | a | b | 258  |       |     | 81,74,75 |
| 4  | 258   | $a_3$ | 258 | a | NONE | 258   | 260 | 82,74-80 |
| 5  | $a_3$ | $b_3$ | a | b | 258  |       |     | 81,74,75 |
| 6  | 258   | $a_4$ | 258 | a | 260  |       |     | 82,74,75 |
| 7  | 260   | $b_4$ | 260 | b | NONE | 260   | 261 | 82,74-80 |
| 8  | $b_4$ | $c_1$ | b | c | NONE | $b_4$ | 262 | 81,74-80 |
| 9  | $c_1$ | $a_5$ | c | a | NONE | $c_1$ | 263 | 81,74-80 |
| 10 | $a_5$ | $b_5$ | a | b | 258  |       |     | 81,74,75 |
| 11 | 258   | $c_2$ | 258 | c | NONE | 258   | 264 | 82,74-80 |
| 12 | $c_2$ | $a_6$ | c | a | 263  |       |     | 81,74,75 |
| 13 | 263   | $b_6$ | 263 | b | NONE | 263   | 265 | 82,74-80 |
| 14 | $b_6$ | $c_3$ | b | c | 262  |       |     | 81,74,75 |
| 15 | 262   | $a_7$ | 262 | a | NONE | 262   | 266 | 82,74-80 |
| 16 | $a_7$ | $b_7$ | a | b | 258  |       |     | 81,74,75 |
| 17 | 258   | $c_4$ | 258 | c | 264  |       |     | 82,74,75 |
| 18 | 264   | $d_1$ | 264 | d | NONE | 264   | 267 | 82,74-80 |
| 19 | $d_1$ | .. |  |  |  | $d_1$ |  | 81,74,76,END |

FIGURE 4

MATRIX IMPLEMENTED DATA COMPRESSION APPARATUS AND METHOD

CROSS REFERENCE TO RELATED APPLICATION

U.S. patent application Ser. No. 10/101,046 "Prefix Table Implemented Data Compression Method and Apparatus" by Cooper, filed Mar. 19, 2002, discloses a prefix table implementation for LZ dictionary type compressors.

BACKGROUND OF THE INVENTION

1. Field of the Invention

The invention relates to data compression systems based on the LZ data compression methodology and more particularly on the LZW protocols.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, Sep. 1978, pp. 530–536. A ubiquitously used data compression and decompression system known as LZW is described in U.S. Pat. No. 4,558,302 by Welch, issued Dec. 10, 1985. LZW has been adopted as the compression and decompression standard used in the GIF image communication protocol and is utilized in the TIFF image communication protocol. GIF is a development of CompuServe Incorporated and the name GIF is a Service Mark thereof. A reference to the GIF specification is found in GRAPHICS INTERCHANGE FORMAT, Version 89a, Jul. 31, 1990. TIFF is a development of Aldus Corporation and the name TIFF is a Trademark thereof. Reference to the TIFF specification is found in TIFF, Revision 6.0, Final—Jun. 3, 1992.

LZW has also been adopted as the standard for V.42 bis modem compression and decompression. A reference to the V.42 bis standard is found in CCITT Recommendation V.42 bis, Data Compression Procedures For Data Circuit Terminating Equipment (DCE) Using Error Correction Procedures, Geneva 1990. The V.42 bis standard is further described in an article entitled "V.42 bis: The New Modem Compression Standard" by J. E. MacCrisken in the Spring 1991 issue of the Journal Of Data & Computer Communications—Modem Compression, pages 23–29.

Examples of LZ dictionary based compression and decompression systems are described in the following U.S. patents: U.S Pat. No. 4,464,650 by Eastman et al., issued Aug. 7, 1984; U.S. Pat. No. 4,814,746 by Miller et al., issued Mar. 21, 1989; U.S. Pat. No. 4,876,541 by Storer, issued Oct. 24, 1989; U.S. Pat. No. 5,153,591 by Clark, issued Oct. 6, 1992; U.S. Pat. No. 5,373,290 by Lempel et al., issued Dec. 13, 1994; U.S. Pat. No. 5,838,264 by Cooper, issued Nov. 17, 1998; U.S. Pat. No. 5,861,827 by Welch et al., issued Jan. 19, 1999; and U.S. Pat. No. 6,320,523 by York et al., issued Nov. 20, 2001.

In the above dictionary based LZ compression and decompression systems, the compressor and decompressor dictionaries may be initialized with all of the single character strings of the character alphabet. In some implementations, the single character strings are considered as recognized and matched although not explicitly stored. In such systems the value of the single character may be utilized as its code and the first available code utilized for multiple character strings would have a value greater than the single character values. In this way the decompressor can distinguish between a single character string and a multiple character string and recover the characters thereof. For example, in the ASCII environment, the alphabet has an 8 bit character size supporting an alphabet of 256 characters. Thus, the characters have values of 0–255. The first available multiple character string code can, for example, be 258 where the codes 256 and 257 are utilized as control codes as is well known.

In the prior art dictionary based LZ compression systems, data character strings are stored and accessed in the compressor dictionary utilizing well known searchtree architectures and protocols. Typically, the searchtree is arranged in nodes where each node represents a character, and a string of characters is represented by a node-to-node path through the tree. When the input character stream has been matched in the dictionary tree up to a matched node, a next input character is fetched to determine if the string match will continue. Conventionally, a determination is made to ascertain if the fetched character is already stored as an extension node of the matched node. Various techniques are utilized to effect this determination such as associative memory dictionaries, hashing and sibling lists as are well understood in the art.

In the above dictionary based systems, numerous dictionary accesses are required at the compressor for compressing an input stream of data characters. Normally several dictionary accesses are required for each input data character and when utilizing an associative memory, it may be necessary to search the entire memory to determine if a string exists therein. It is desirable in such systems to minimize the number of dictionary accesses so as to enhance system performance.

Although the known dictionary architecture and protocols provide efficient data compression systems, it is a continuing objective in the art to improve compressor performance.

SUMMARY OF THE INVENTION

The present invention replaces the conventional dictionary arrangements with digital logic elements and switches to provide a new architecture and protocols which, it is believed, will improve the performance of LZ type data compression systems.

The present invention is embodied in a data compressor for compressing an input stream of data characters into an output stream of compressed codes. The compressor includes a plurality of coincidence elements corresponding to a respective plurality of strings, the coincidence elements having a respective plurality of coincidence outputs. A string is comprised of a prefix string of at least one of the data characters followed by an extension character, a prefix string having a prefix code associated therewith. A coincidence element includes inputs responsive, respectively, to a representation of a predetermined prefix code and a representation of a predetermined character for energizing the coincidence output thereof upon coincidental energization of the inputs.

A plurality of codes are assigned to selected coincidence elements, respectively, so that energization of a coincidence output of a selected coincidence element provides a representation of the code assigned thereto. The provided representations of codes assigned to the coincidence elements are coupled to the prefix code inputs of the coincidence elements and representations of data characters fetched from the input stream are coupled to the character inputs of the coincidence elements.

Data characters are sequentially fetched from the input stream so as to sequentially energize coincidence outputs until a last coincidence output is energized of a coincidence element that does not have a code assigned thereto. The code is output that is assigned to the coincidence element having the coincidence output energized prior to the last coincidence output so as to provide the stream of compressed codes. A next assignable code is assigned to the coincidence element having the last energized coincidence output.

Specifically, in the preferred embodiments, a switch arrangement, such as a matrix switch, is included having a plurality of switch inputs and a plurality of switch outputs, the plurality of coincidence outputs being coupled to the plurality of switch inputs, respectively. The switch is controllably operative for coupling any one of the switch inputs to a selected one of the switch outputs, so that the coincidence outputs are selectively coupled to the switch outputs. Code assignment elements are included for assigning the plurality of codes to the plurality of switch outputs, respectively, so that energization of a coincidence output coupled to a switch output provides a representation of the code assigned to the switch output.

The provided representations of codes assigned to the switch outputs are coupled to the prefix code inputs of the coincidence elements and representations of data characters fetched from the input stream are coupled to the character inputs of the coincidence elements.

Data characters are sequentially fetched from the input stream so as to sequentially energize switch outputs until a coincidence output is energized that is not coupled to a switch output. The code assigned to the last energized switch output is outputted to provide the stream of compressed codes. The switch is controlled to selectively couple the last energized coincidence output to the switch output corresponding to the next assignable code.

In the preferred embodiments, a representation of the fetched data character that resulted in energizing the last coincidence output is applied to the prefix code inputs of the coincidence elements to begin a next compression cycle.

BRIEF DESCRIPTION OF THE DRAWINGS

FIG. 4 is a chart exemplifying the operations of the compressor of FIG. 1 in accordance with the control flow chart of FIG. 2.

DESCRIPTION OF THE PREFERRED EMBODIMENTS

The best mode embodiments described below, utilizing the matrix implementation architecture of the present invention, are predicated, generally, on the LZW methodology. The embodiments are implemented in a manner similar to that described above where the single character strings are considered as recognized by the compressor although not explicitly included therein.

Figure 1:
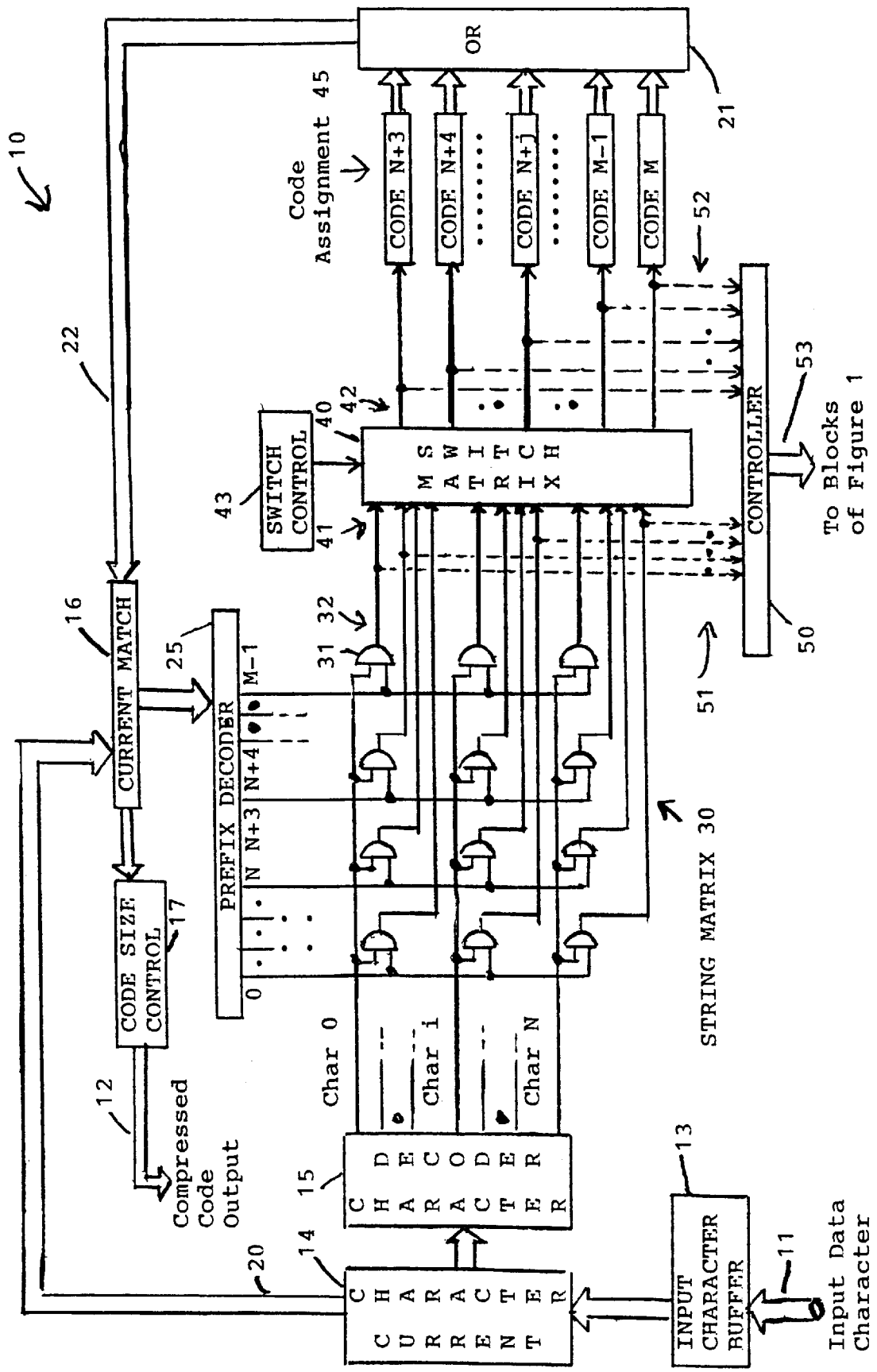
FIG. 1 is a schematic block diagram of a data compressor for compressing data in accordance with the present invention.

Referring to FIG. 1, a data compressor 10 is illustrated that compresses a stream of input data characters applied at an input 11 into a stream of corresponding compressed codes at an output 12. The input data character stream is buffered in an input character buffer 13. A current character register 14 is included for sequentially fetching the data characters from the buffer 13. The output of the current character register 14 is applied to a character decoder 15 that energizes a unique output thereof in accordance with the character held in the current character register. The energized output of the character decoder 15 thus provides a representation of the character held in the current character register. When the alphabet over which compression is being performed comprises N characters, the outputs of the character decoder 15 are accordingly denoted as char 0—char N, respectively.

A string of data characters is comprised of a prefix string of one or more characters followed by an extension character, where the prefix string has a prefix code associated therewith. Single character prefix strings conveniently utilize the character values as the prefix codes. In a manner to be described, a string is represented in the compressor 10 and has a string code assigned thereto. A string code of N+3 is the first available string code assigned by the compressor 10 and a string code of M is the maximum assignable string code. The codes N+1 and N+2 may be utilized as control codes, as is well known.

Typically, LZW data compressors are limited to 4096 string codes. When this limitation is applied to the present embodiment and when in the ASCII environment, the alphabet has an 8 bit character size supporting an alphabet of 256 characters having character values of 0–255. The first available multiple character string code may be 258 with the codes 256 and 257 utilized as control codes. In this example, the maximum assignable string code M is 4095.

The compressor 10 further includes a current match register 16 for holding the prefix code of a string under test. At the end of a compression cycle, the current match register 16 contains the code of a longest matched string which is provided from the current match register to the output 12 through a code size control circuit 17. The code size control circuit 17 is utilized, as is well known, to control the number of bits utilized for transmitting the compressed code from the output 12. In a variable length code implementation, the code size may begin with 9 bits and sequentially increase to 10, 11 and 12 bits at codes 512, 1024 and 2048, respectively. It is appreciated that a fixed code size may also be utilized to implement the embodiment.

To begin an initial compression cycle, the first character in the input data character stream is transferred through the current character register 14 to the current match register 16 via a bus 20. To begin a subsequent compression cycle, the current match register 16 is set to the mismatching character from the current character register 14 determined from the preceding compression cycle. During the compression cycles, prefix codes of strings under test are applied to the current match register 16 from an OR-gate 21 via a bus 22 in a manner to be described.

The output of the current match register 16 is applied to a-prefix decoder 25 that energizes a unique output thereof in accordance with the value of the prefix code held in the current match register. The uniquely energized output of the prefix decoder 25 thus provides a representation of the prefix code residing in the current match register. The outputs of the prefix decoder 25 are denoted as prefix codes 0 through M-1 with intermediate values N, N+3 and N+4, as illustrated. The codes N+1 and N+2 may be utilized as control codes and are therefore not illustrated as outputs of the decoder 25. Using the above example of the ASCII environment with a maximum of 4096 codes, N will be 255, M will be 4095 with the maximum prefix code M−1 of 4094. The first available code N+3 will be 258 and the control codes may be 256 and 257.

It is appreciated that one of the prefix decoder outputs 0 through N will be energized for a single character prefix value held in the current match register 16 and that one of the outputs N+3 through M−1 will be energized when the code of a multiple character prefix resides in the current match register 16. It is furthermore appreciated that when one of the prefix decoder outputs 0–N is energized, the string under test is a two-character string.

The compressor 10 further includes a string matrix 30 comprised of a plurality of coincidence elements such as coincidence element 31. In the preferred embodiments of the invention, the coincidence elements 31 are implemented by AND-gates. The AND-gates are conveniently arranged in a matrix with the outputs of the character decoder 15 providing inputs to the matrix rows and with the outputs of the prefix decoder 25 providing inputs to the matrix columns. Each intersecting row and column includes an AND-gate that receives one input from the character decoder 15 and one input from the prefix decoder 25.

The plurality of AND-gates provide a plurality of respective coincidence outputs 32. When a prefix code in the current match register 16 results in energization of a particular output of the prefix decoder 25 and a character in the current character register 14 results in the energization of a particular output of the character decoder 15, the coincidence output 32 of the AND-gate having inputs coupled to the particular decoder outputs is energized.

The plurality of AND-gates correspond to a respective plurality of data character strings. An AND-gate corresponds to a string in accordance with the intersection of the string matrix 30 at which the AND-gate is located. For example, the AND-gate at the intersection of N+3 and char i corresponds to a string having a prefix string to which code N+3 is assigned and having an extension character of char i. It is appreciated that the AND-gates in the matrix columns 0 through N correspond to two-character strings with single character prefixes whereas the AND-gates in the columns N+3 through M−1 correspond to strings having multiple character prefix strings.

The compressor 10 further includes a matrix switch 40 with a plurality of inputs 41 and a plurality of outputs 42. The plurality of coincidence outputs 32 from the AND-gates are coupled, respectively, to the inputs 41 of the matrix switch 40. A switch control 43, coupled to the matrix switch 40, controls the matrix switch to selectively couple any one of the switch inputs 41 to a selected one of the switch outputs 42. In this manner, the coincidence outputs 32 of the AND-gates are selectively coupled to the switch outputs 42.

The plurality of outputs 42 are coupled, respectively, to a plurality of code assignment elements 45. The code assignment elements 45 assign the codes N+3 through M to the respective matrix switch outputs 42 and thus to the selectively coupled matrix switch inputs. Energization of a coincidence output 32, coupled to a matrix switch input 41 and through the matrix switch 40 to a switch output 42, provides a representation of the code assigned to the switch output. Energization of a matrix switch output 42 results in the associated code assignment element 45 providing the assigned code in binary format to the OR-gate 21. It is appreciated that since the codes are uniquely assigned to the switch outputs 42, the energization of the switch output is also a representation of the code.

The bus 22, the current match register 16 and the prefix decoder 25 couple a representation of the code assigned to an energized switch output 42 to the prefix code inputs of the AND-gates of the string matrix 30. The code assigned to an energized matrix switch output 42 applied through the OR-gate 21, current match register 16 and prefix decoder 25 results in energization of the prefix decoder output corresponding to the code. For example, energization of the matrix switch output 42 having code M−1 assigned thereto results in the energization of the M−1 prefix code output of the prefix decoder 25.

The compressor 10 includes a controller 50 responsive to control inputs represented as dashed lines. The controller 50 receives control inputs 51 from the matrix switch inputs 41 and control inputs 52 from the matrix switch outputs 42. The controller 50 provides control signals to the blocks of FIG. 1, as indicated by an arrow 53, to control the operations of the compressor 10 in a manner to be described.

Figure 2:
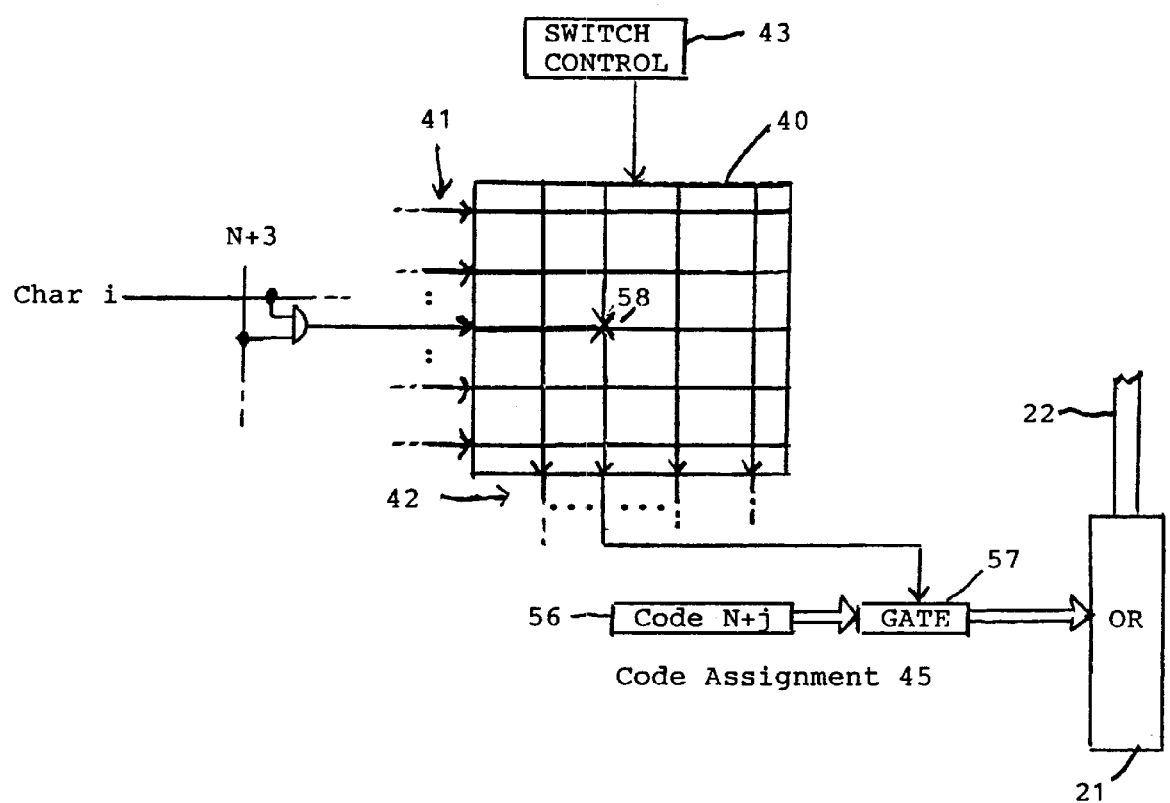
FIG. 2 is a schematic block diagram illustrating details of the matrix switch and code assignment components of FIG. 1.

Referring to FIG. 2, where like reference numerals indicate like components with respect to FIG. 1 and with continued reference to FIG. 1, further details of the matrix switch 40 and, the code assignment elements 45 are illustrated. The matrix switch 40 is comprised of rows coupled to the matrix switch inputs 41 and columns coupled to the matrix switch outputs 42. Each row and column intersection is a controllable switch connection actuated by the switch control 43. The switch control 43 is operative for coupling any one of the switch inputs 41 to a selected one of the switch outputs 42.

The code assignment element 45 is comprised of a string code register 56 and a gate 57. The register 56 is illustrated as holding code N+j. When a connection 58 is effected by the switch control 43, the coincidence output of the AND-gate at the intersection of N+3 and char i is coupled to the gate 57. Upon coincidental occurrence of prefix code N+3 and the character denoted as char i, the coincidence output of the AND-gate is energized and through the switch connection 58 enables the gate 57. The code N+j in the register 56 is transmitted through the enabled gate 57 to the OR-gate 21. As previously described with respect to FIG. 1, the code N+j is then transmitted via the bus 22 to the current match register 16.

Briefly, the operation of the compressor 10 is as follows. The compressor 10 operates in compression cycles wherein strings of data characters fetched from the input data character stream are compared to strings previously encountered by the compressor 10 to determine the longest match therewith. The code of the prefix in the current match register 16 of a string under test and the currently fetched character in the current character register 14 enables the associated AND-gate of the string matrix 30. The controller 50 determines if the energized coincidence output of the enabled AND-gate is connected through the matrix switch to a matrix switch output by determining if a matrix switch output 42 is energized. If a matrix switch output is energized, the code assigned thereto is transferred to the current match register 16 and the next input data character is fetched to the current character register 14. The procedure is repeated until the controller 50 determines that no matrix switch output 42 is energized. When this occurs, the code of the longest matching string resides in the current match register 16 and is provided at the output 12 in the number of bits determined by the code size control 17.

An appropriate update extended string is entered into the compressor 10 by closing the appropriate switch connection in the matrix switch 40. Accordingly, with the longest match code in the current match register 16 and the currently fetched character in the current character register 14 that resulted in no matrix switch output energization, the controller 50, via the switch control 43, connects the matrix switch input 41 energized by the coincidence output of the enabled AND-gate to the matrix switch output 42 that has the next available code assigned thereto. To begin the next compression cycle, the character in the current character register 14 is transferred to the current match register 16 and the next input data character is fetched to the current character register 14.

Figure 3:
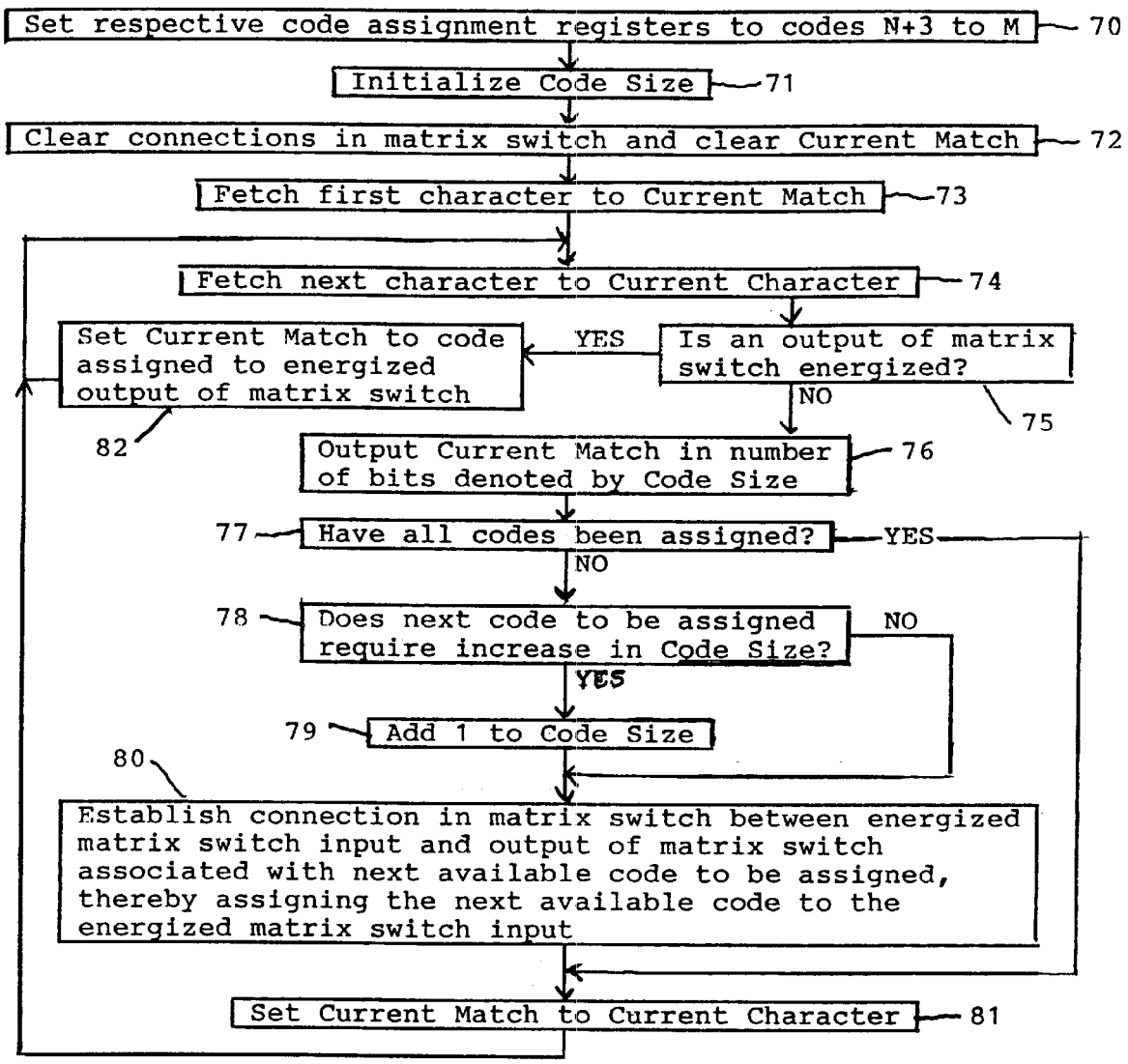
FIG. 3 is a control flow chart illustrating the operations executed by the compressor of FIG. 1 so as to perform data compression in accordance with the present invention.

Referring to FIG. 3, with continued reference to FIGS. 1 and 2, a control flow chart is illustrated showing the detailed flow of operations to be executed by the compressor 10. The controller 50 is considered as containing appropriate circuitry, such as state machines, to control execution of the operations.

Control enters a block 70 whereat the registers 56 (FIG. 2) of the respective code assignment elements 45 are set to the codes N+3 to M. Since the codes N+3 to M are sequentially assigned to strings encountered in the input, all of the codes may initially be set into the respective code assignment registers. Alternatively, the codes may be sequentially set into the registers from a code counter when required.

At a block 71, the code size control 17 is initialized to the beginning code size, for example, 9 bits in ASCII embodiments. At a block 72, the current match register 16 is cleared and all of the connections in the matrix switch 40 are opened. At a block 73, the first input data character is fetched to the current match register 16 and, at a block 74, the next input data character is fetched to the current character register 14.

At a block 75, the controller 50 tests the control inputs 52 to determine if a matrix switch output 42 is energized. If not, control proceeds to a block 76 at which the code in the current match register 16 is provided at the output 12 utilizing the number of bits determined by the code size control 17.

Control proceeds from the block 76 to a block 77 whereat the controller 50 determines if all of the codes have been assigned to encountered strings. If a next code is available to be assigned, control proceeds to a block 78 whereat the next code to be assigned is tested to determine if an increase in code size is required. If so, control continues to a block 79 whereat the code size determined by the code size control 17 is incremented by 1. If an increase in code size is not required at the block 78, the block 79 is bypassed to continue the operations at a block 80.

At the block 80, the controller 50, via the switch control 43, establishes the connection in the matrix switch 40 between the energized matrix switch input 41 and the matrix switch output 42 associated with the next available code to be assigned. Thus, the next available code is assigned to the energized matrix switch input 41.

By this procedure the next available code is assigned to the string whose prefix is represented by the code resident in the current match register 16 and whose extension character is resident in the current character register 14. As previously described, the associated AND-gate of the string matrix 30 is enabled thereby energizing the associated coincidence output 32 and the matrix switch input 41 coupled thereto.

Control proceeds from the block 80 to a block 81 whereat the current match register 16 is set to the character in the current character register 14 via the bus 20. Control then returns to the block 74 to begin the next compression cycle.

If at the block 75, an output 42 of the matrix switch 40 is determined to be energized, control proceeds to a block 82. At the block 82, the current match register 16 is set, via the bus 22, to the code assigned to the energized matrix switch output. Control then returns to the block 74 to continue searching the input data character stream for a longest matching string.

If at the block 77, all of the codes have been assigned, control proceeds directly to the block 81 bypassing the operations of blocks 78–80.

It is appreciated from the foregoing that the loop comprising the blocks 74, 75 and 82 sequentially fetch the input data characters into the current character register 14 thereby sequentially energizing the switch matrix outputs 42 until an input data character is fetched that results in no energization of a matrix switch output 42. When this occurs the longest matching string has been determined with the code thereof residing in the current match register 16. The extended string comprising the longest match extended by the character residing in the current character register 14 is readily set into the compressor 10 by, at the block 80, establishing the matrix switch connection between the energized matrix switch input 41 and the matrix switch output 42 corresponding to the next assignable code.

Referring to FIG. 4, with continued reference to FIGS. 1–3, an example of the operation of the compressor 10 in accordance with the flow chart of FIG. 3 is illustrated. At the top of FIG. 4, an input data character stream is shown where sequential characters are identified by character sequence numbers. This is done to facilitate following the progress of the characters through the steps of the example. It is appreciated that the sequence numbers are shown for purposes of character identification and do not appear in the actual data character stream.

The example is largely self-explanatory, with the actions performed delineated in the left-hand column and the blocks of FIG. 3 that participate in the actions designated in the right-hand column. The AND-gate energized in an action is identified by the prefix code and character coordinates of the AND-gate in the string matrix 30. If, as the result of applying current match and current character to the string matrix 30, a matrix switch output is energized, the code assigned to the energized matrix switch output is denoted in the designated column. The legend "NONE" is utilized to indicate that no matrix switch output is energized. This occurs when the energized AND-gate is not yet coupled through a matrix switch input to a matrix switch output. The code assignment as discussed above with respect to FIG. 3, block 80, is indicated in the assigned code column. For the purposes of the illustrated example, the available codes to be assigned begin with code 258.

The operational example of FIG. 4 graphically demonstrates the novel data compression implementation architecture of the present invention for recording data character strings in the compressor 10, searching the input stream for the longest match with the recorded strings and updating the recorded strings with an extended string. For example, action 1 illustrates how the string "ab" is recorded in the compressor 10. The single character string "a" is fetched to current match at the block 73 of FIG. 3 and the next character "b" is fetched to current character at block 74. Since the string "ab" has not been encountered before, the enabled "ab" AND-gate is not connected through the matrix switch to a matrix switch output. Accordingly, at the block 76 of FIG. 3, the longest matching string "a" is output and at the block 80, the energized matrix switch input, coupled to the output of the enabled "ab" AND-gate, is connected through the matrix switch to the matrix switch output corresponding to assigned code 258.

In action 3, this string "ab" is again encountered and consequently the matrix switch output assigned to code 258 is energized as detected at block 75 of FIG. 3. In action 4, the code 258 is set into the current match register as indicated at block 82. In action 4, since the enabled "258*a*" AND-gate is not connected to a matrix switch output, the string "aba" is recorded in the compressor 10 by connecting the energized matrix switch input to the code 260 matrix switch output.

In the embodiments described herein, when the last input data character has been fetched, the value in the current match register 16 is output as the last compressed code. Thus, in action 19, the last character of the exemplified input data character stream is output as illustrated.

More detailed descriptions of the actions of FIG. 4 relative to the blocks of FIG. 3 are readily apparent and will not be provided for brevity.

Figure 5:
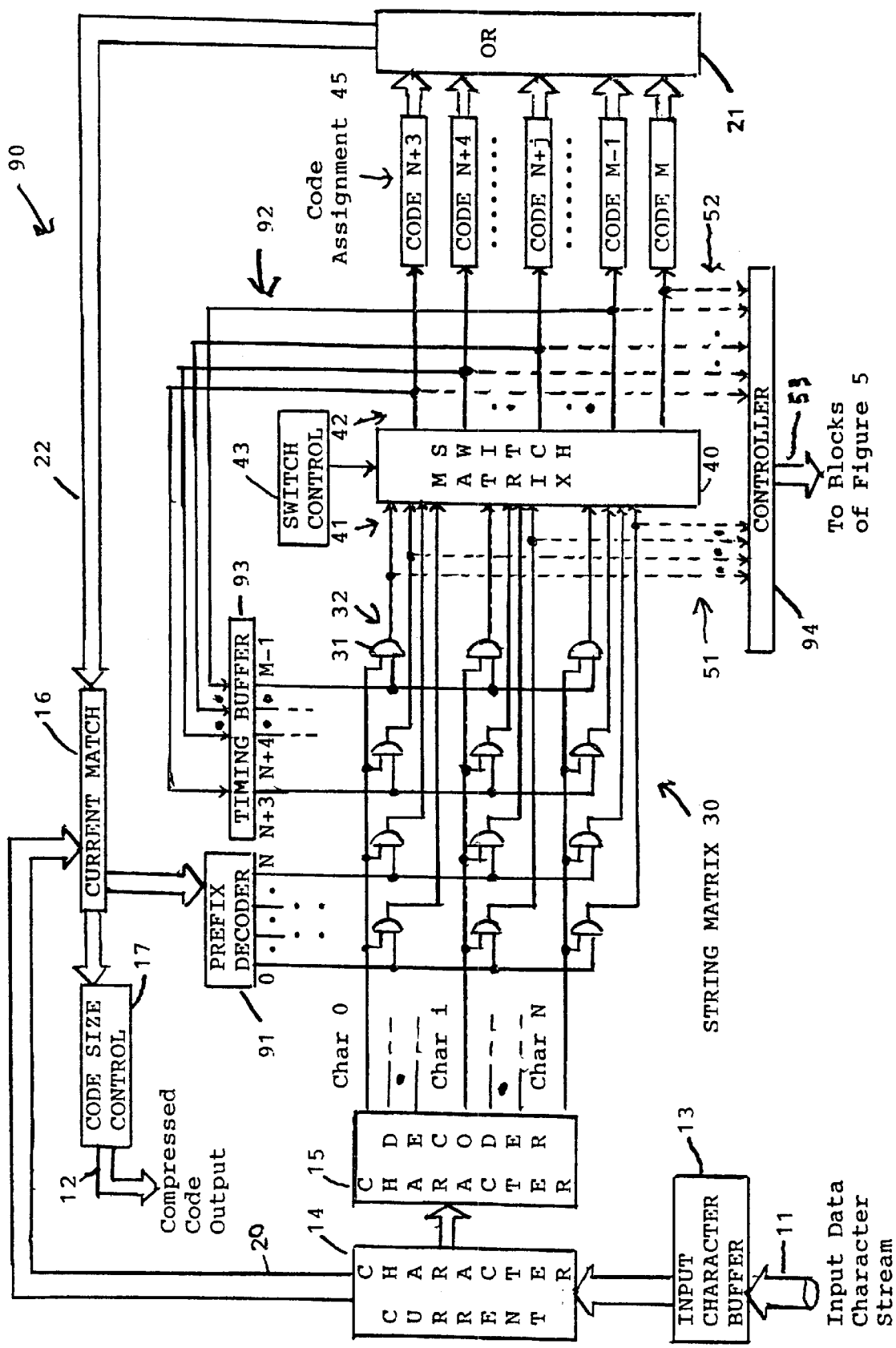
FIG. 5 is a schematic block diagram of an alternative embodiment of a data compressor for compressing data in accordance with the present invention.

Referring to FIG. 5, where like reference numerals indicate like components with respect to FIG. 1 and with continued reference to FIGS. 1–4, an alternative best mode embodiment of the present invention of a data compressor 90 is illustrated. The embodiment of FIG. 5 is substantially similar to the embodiment of FIG. 1 and therefore operates in a manner similar to that described above with respect to FIG. 1 generally following the flow of operations depicted in FIG. 3. The operational example of FIG. 4 is also applicable to the FIG. 5 embodiment.

The principle difference between the embodiments of FIGS. 1 and 5 is the manner in which the prefix code representations are fed back from the matrix switch outputs to the prefix code inputs of the string matrix 30. In FIG. 1, the binary representations of the codes from the code assignment elements 45 are applied through the current match register 16 and prefix decoder 25. In the FIG. 5 embodiment, the energized matrix switch outputs 42 are fed directly back through leads 92 to the prefix code inputs of the string matrix 30.

The prefix code representations conveyed by the leads 92 are applied to the string matrix 30 through a timing buffer 93. The timing buffer 93 is utilized so that an energized matrix switch output 42 is applied to the prefix code inputs of the AND-gates in coincidence with the fetching of the next data character into the current character register 14.

It is appreciated that the energized matrix switch outputs 42 are applied to the prefix code inputs of the string matrix 30 that correspond thereto. For example, as illustrated, the matrix switch outputs with assigned codes N+3, N+4 and M−1 are applied to the corresponding prefix code inputs of the string matrix 30.

In the FIG. 5 embodiment, a prefix decoder 91 is coupled to the current match register 16 to provide the prefix code representations for the single character prefix strings denoted as 0 through N. These outputs of the prefix decoder 91 are applied to the appropriate columns of the string matrix 30. It is appreciated that the AND-gates coupled to the outputs of the prefix decoder 91 represent the two-character strings.

In the operation of the compressor 90, it is appreciated that the prefix decoder 91 is designed so that it only responds to the single character code values in the current match register 16 to provide the corresponding prefix decoder outputs 0 through N. When the multiple character string codes N+3 and greater are entered into the current match register 16, the prefix decoder 91 does not provide an output.

Conveniently, the codes from the OR-gate 21 are sequentially entered into the current match register 16, as described above, so that when a character is fetched to the current character register 14 that results in no energized output of the matrix switch 40, the current match register 16 will be holding the code of the longest matching string. Alternatively, a longest match buffer can be included in the compressor 90 for receiving the codes from the bus 22 and providing the code of the longest match to the code size control 17.

The compressor 90 includes controller 94 for controlling the operations in a manner similar to that described above with respect to the controller 50 of FIG. 1. The controller 94 additionally includes circuitry for controlling the operations specific to the elements 91–93 as described.

It is appreciated that the operations of the above-described data compression embodiments generally follow the LZW protocols. The compressors provide an LZW compressed code output wherefrom the corresponding data character stream is recoverable by a standard LZW decompressor configuration.

The embodiments of the present invention are substantially universal with respect to alphabet size. With N selected as a limiting alphabet size, smaller alphabets are accommodated by adjusting the codes stored in the code assignment registers 56 (FIG. 2). For example, if N is 256 the first assignable code N+3 may be 258. If N is 4, the first assignable code N+3 may be 6.

Although the above disclosed embodiments of the present invention are described in terms of the LZW data compression protocols, it is appreciated that the architecture of the present invention can be readily utilized with other data compression protocols such as, for example, LZ2.

It is further appreciated that the matrix switch 40 and the code assignment elements 45 assign a plurality of codes to selected coincidence elements, respectively, so that energization of a coincidence output of a selected coincidence element provides a representation of the code assigned thereto.

While the invention has been described in its preferred embodiments, it is to be understood that the words which have been used are words of description rather than of limitation and that changes may be made within the purview of the appended claims without departing from the true scope of the invention in its broader aspects.

What is claimed is:

1. Data compression apparatus for compressing an input stream of data characters into an output stream of compressed codes, comprising a plurality of coincidence elements corresponding to a respective plurality of strings, a string being comprised of a prefix string of at least one of said data characters followed by an extension character, a prefix string having a prefix code associated therewith, said plurality of coincidence elements providing a respective plurality of coincidence outputs, a coincidence element having inputs responsive, respectively, to a representation of a predetermined prefix code and a representation of a predetermined character for energizing the coincidence output thereof upon coincidental energization of the inputs thereof, means for assigning a plurality of codes to selected coincidence elements, respectively, so that energization of a coincidence output of a selected coincidence element provides a representation of the code assigned thereto, means for coupling the provided representations of codes assigned to the coincidence elements to the prefix code inputs of the coincidence elements, means for coupling representations of data characters fetched from said input stream to the character inputs of the coincidence elements, means for sequentially fetching data characters from said input stream so as to sequentially energize coincidence outputs until a last coincidence output is energized of a coincidence element that does not have a code assigned thereto, and means for outputting the code assigned to the coincidence element having the coincidence output energized prior to said last coincidence output, thereby providing said stream of compressed codes, said means for assigning being operable for assigning a next assignable code to the coincidence element having said last coincidence output.

2. Data compression apparatus for compressing an input stream of data characters into an output stream of compressed codes, comprising a plurality of coincidence elements corresponding to a respective plurality of strings, a string being comprised of a prefix string of at least one of said data characters followed by an extension character, a prefix string having a prefix code associated therewith, said plurality of coincidence elements providing a respective plurality of coincidence outputs, a coincidence element having inputs responsive, respectively, to a representation of a predetermined prefix code and a representation of a predetermined character for energizing the coincidence output thereof upon coincidental energization of the inputs thereof, switch means having a plurality of switch inputs and a plurality of switch outputs, said plurality of coincidence outputs being coupled to said plurality of switch inputs, respectively, said switch means being controllably operative for coupling any one of said switch inputs to a selected one of said switch outputs so that said coincidence outputs are selectively coupled to said switch outputs, code assignment means for assigning a plurality of codes to said plurality of switch outputs, respectively, so that energization of a coincidence output coupled to a switch output provides a representation of the code assigned to the switch output, means for coupling the provided representations of codes assigned to the switch outputs to the prefix code inputs of the coincidence elements, means for coupling representations of data characters fetched from said input stream to the character inputs of the coincidence elements, means for sequentially fetching data characters from said input stream so as to sequentially energize switch outputs until a coincidence output is energized that is not coupled to a switch output, means for outputting the code assigned to the last energized switch output, thereby providing said stream of compressed codes, and means for selectively coupling the last energized coincidence output to the switch output corresponding to the next assignable code.

3. The apparatus of claim 1 or 2 wherein said apparatus operates in compression cycles, further including means for applying a representation of the fetched data character that resulted in energizing the last coincidence output to prefix code inputs of said coincidence elements to begin a next compression cycle.

4. The apparatus of claim 1 or 2 wherein said plurality of coincidence elements comprises a plurality of AND-gates.

5. The apparatus of claim 1 or 2 wherein said plurality of coincidence elements comprises a matrix of coincidence elements.

6. The apparatus of claim 2 wherein said switch means comprises a matrix switch.

7. The apparatus of claim 2 wherein said code assignment means comprises a code register for holding one of said codes, and a transmission gate coupled to said code register and enabled by a switch output for transmitting the code in said code register upon energization of said switch output.

8. The apparatus of claim 1 or 2 wherein said data characters are from an alphabet of data characters and wherein said means for coupling representations of data characters comprises a character register for holding a data character, and a character decoder coupled to said character register for providing a plurality of outputs corresponding to the respective characters of said alphabet, a unique decoder output being energized in accordance with the character held in said character register, said outputs of said character decoder providing said representations of data characters to the character inputs of the coincidence elements.

9. The apparatus of claim 1 or 2 wherein said means for coupling the provided representations of codes comprises a code register for holding a prefix code, and a code decoder coupled to said code register for providing a plurality of outputs corresponding to a respective plurality of prefix codes, a unique decoder output being energized in accordance with the code held in said code register, said outputs of said code decoder providing said representations of codes to said prefix code inputs of the coincidence elements.

10. The apparatus of claim 2 wherein said means for coupling the provided representations of codes comprises means for directly coupling said plurality of switch outputs to a respective plurality of prefix code inputs of the coincidence elements.

11. The apparatus of claim 10 wherein said means for coupling the provided representations of codes further includes a code decoder responsive to character values for providing a plurality of outputs corresponding to respective characters, a unique decoder output being energized in accordance with the character value applied thereto, said outputs of said code decoder providing said representation of codes to a predetermined plurality of the prefix code inputs of the coincidence elements.

12. A data compression method for compressing an input stream of data characters into an output stream of compressed codes, comprising providing a plurality of coincidence elements corresponding to a respective plurality of strings, a string being comprised of a prefix string of at least one of said data characters followed by an extension character, a prefix string having a prefix code associated therewith, said plurality of coincidence elements providing a respective plurality of coincidence outputs, a coincidence element having inputs responsive, respectively, to a representation of a predetermined prefix code and a representation of a predetermined character for energizing tile coincidence output thereof upon coincidental energization of the inputs thereof, assigning a plurality of codes to selected coincidence elements, respectively, so that energization of a coincidence output of a selected coincidence element provides a representation of the code assigned thereto, coupling the provided representations of codes assigned to the coincidence elements to the prefix code inputs of the coincidence elements, coupling representations of data characters fetched from said input stream to the character inputs of the coincidence elements, sequentially fetching data characters from said input stream so as to sequentially energize coincidence outputs until a last coincidence output is energized of a coincidence element that does not have a code assigned thereto, and outputting the code assigned to the coincidence element having the coincidence output energized prior to said last coincidence output, thereby providing said stream of compressed codes, said assigning step including assigning a next assignable code to the coincidence element having said last coincidence output.

13. A data compression method for compressing an input stream of data characters into an output stream of compressed codes, comprising providing a plurality of coincidence elements corresponding to a respective plurality of strings, a string being comprised of a prefix string of at least one of said data characters followed by an extension character, a prefix string having a prefix code associated therewith, said plurality of coincidence elements providing a respective plurality of coincidence outputs, a coincidence element having inputs responsive, respectively, to a representation of a predetermined prefix code and a representation of a predetermined character for energizing the coincidence output thereof upon coincidental energization of the inputs thereof, providing a switch arrangement having a plurality of switch inputs and a plurality of switch outputs, said plurality of coincidence outputs being coupled to said plurality of switch inputs, respectively, said switch arrangement being controllably operative for coupling any one of said switch inputs to a selected one of said switch outputs so that said coincidence outputs are selectively coupled to said switch outputs, assigning a plurality of codes to said plurality of switch outputs, respectively, so that energization of a coincidence output coupled to a switch output provides a representation of the code assigned to the switch output, coupling the provided representations of codes assigned to the switch outputs to the prefix code inputs of the coincidence elements, coupling representations of data characters fetched from said input stream to the character inputs of the coincidence elements, sequentially fetching data characters from said input stream so as to sequentially energize switch outputs until a coincidence output is energized that is not coupled to a switch output, outputting the code assigned to the last energized switch output, thereby providing said stream of compressed codes, and selectively coupling the last energized coincidence output to the switch output corresponding to the next assignable code.

14. The method of claim 12 or 13 wherein said method operates in compression cycles, further including applying a representation of the fetched data character that resulted in energizing the last coincidence output to prefix code inputs of said coincidence elements to begin a next compression cycle.

* * * * *